US005697074A

United States Patent [19]

Makikallio et al.

[11] Patent Number: 5,697,074

[45] Date of Patent: Dec. 9, 1997

[54] DUAL RATE POWER CONTROL LOOP FOR A TRANSMITTER

[75] Inventors: Eero Makikallio; Raimo Klemetti; Jorma Savolainen; Mika Tuutijarvi; Hannu Pakonen, all of Oulu, Finland

[73] Assignee: Nokia Mobile Phones Limited, Salo, Finland

[21] Appl. No.: 413,589

[22] Filed: Mar. 30, 1995

[51] Int. Cl.$^6$ .......... H04B 1/04

[52] U.S. Cl. .......... 455/126; 455/127; 455/115; 330/141; 330/281; 370/294

[58] Field of Search .......... 455/126, 127, 455/232.1, 234.1, 234.2, 239.1, 240.1, 241.1, 242.2, 244.1, 115, 67.1, 117, 116; 330/141, 281, 138, 280, 129, 279, 278; 370/95.3, 318, 294

[56] References Cited

U.S. PATENT DOCUMENTS

| | | | |
|---|---|---|---|
| 3,620,631 | 11/1971 | Stopka et al. | 455/239.1 |
| 4,019,150 | 4/1977 | Lurey et al. | 455/126 |
| 4,458,209 | 7/1984 | Miller et al. | 330/141 |
| 4,636,741 | 1/1987 | Mitzlaff . | |
| 4,992,753 | 2/1991 | Jenson et al. | 455/126 |
| 5,179,353 | 1/1993 | Miyake . | |
| 5,276,917 | 1/1994 | Vanhanen et al. . | |
| 5,296,821 | 3/1994 | Petersen et al. | 330/141 |
| 5,337,201 | 8/1994 | Oyama | 330/141 |
| 5,416,441 | 5/1995 | Nagano | 455/126 |
| 5,566,363 | 10/1996 | Senda | 455/126 |

FOREIGN PATENT DOCUMENTS

| | | | |
|---|---|---|---|
| 0128806 | 7/1984 | Japan | 330/138 |

*Primary Examiner*—Reinhard J. Eisenzopf
*Assistant Examiner*—Doris To
*Attorney, Agent, or Firm*—Perman & Green, LLP

[57] ABSTRACT

A power control loop for a radio frequency transmitter includes a power control amplifier, an output and a detector that is coupled to the output for providing an output power signal indicative of output power from the power control loop. A controller generates at least first and second reference signals. A differential amplifier provides a control output that is indicative of a difference between the output power signal and a reference signal. A dual rate filter couples the control output to the power control amplifier so as to vary its gain. The dual rate filter exhibits a fast-reacting filter mode when the controller changes the reference signals to the differential amplifier and a slow-reacting filter mode when the controller applies the first reference signal to the differential amplifier. The fast filter mode enables rapid feedback of the control output to the power control amplifier.

6 Claims, 2 Drawing Sheets

DUAL RATE POWER CONTROL LOOP FOR A TRANSMITTER

FIELD OF THE INVENTION

This invention relates to radio transceivers and, more particularly, to a dual rate power control circuit for a transceiver which operates in a time division multiple access (TDMA) environment.

BACKGROUND OF THE ART

In a TDMA system, each user is allocated to an identical carrier frequency, however, each user in that particular carrier frequency transmits during a different time slot. As a result, each user's transmitter must transition from an off to an on state at the beginning of a transmission time slot and then back to an off state at the end of the transmission time slot. Such transitions, unless closely controlled, are known to adversely affect the output frequency spectrum of the transmitter. The prior art has controlled such power transitions through use of feedback filtering in a power control loop in a transmitter's power amplifier section. The prior art has also employed a differential amplifier in the feedback circuit to which a shaped reference voltage was applied to enable a ramping of the transmitter's power circuitry.

An exemplary transmit time slot is shown in FIG. 1 and includes both ramp up and ramp down periods 10 and 12, during which periods a transmitter's power amplification is gradually increased and then gradually decreased. During period 14, the transmitter carrier signal is modulated with applied data. It is during periods 10 and 12 that it is critical to control the transmitter's power transitions so as to prevent frequency spreading.

In U.S. Pat. No. 5,276,917 to Vanhanen et al., a transmitter power control circuit is disclosed wherein power amplifier sections are switched on in sequence so that the transmitter's power output ramps up in a controlled manner. In a similar fashion, the power amplifier sections are switched off in sequence to enable a ramp down of the transmitter's output power. U.S. Pat. No. 4,636,741 to Mitzlaff describes a transmitter power control circuit which enables dual levels of power to be output from the transmitter. The Mitzlaff circuit is adapted for use in duplex portable radio transceivers which may be inserted into a vehicular adapter for operation from the vehicle's battery. U.S. Pat. No. 5,179,353 to Miyake discloses a power control circuit for a transceiver which operates in both analog and digital modes. Miyake applies a feedback signal to the gain control terminal of a power amplifier and, in an analog mode, applies a fixed bias which causes the amplifier to operate in the Class C mode. When operated in the digital mode, the feedback circuit causes the power amplifier to operate in Class A mode.

As indicated above, prior art power control circuits employ a filter function in the feedback control circuit to adjust the rate of response of a transceiver's power transitions. Many TDMA applications employ amplitude modulation of the carrier signal. In such systems, the power control loop must be slow enough reacting so that the modulation's amplitude variations are not adversely affected. By contrast, the loop filter cannot be set to respond too slowly or else the power ramp up and ramp downtimes become excessive. It is difficult to find a filter response rate which will enable power amplifier response times in the time allotted within modern TDMA systems. This is especially so in digital cellular telephone applications.

Accordingly, it is an object of this invention to provide an improved power control loop for a TDMA transceiver.

It is another object of this invention to provide an improved power control loop that enables precise control of power transitions of a power amplifier during both ramp up and ramp down so that frequency spreading of output transitions is avoided.

It is still another object of this invention to provide an improved power control circuit which is particularly adapted for use in a cellular telephone operating in the digital mode.

SUMMARY OF THE INVENTION

A power control loop for a radio frequency transmitter includes a power control amplifier, an output and a detector that is coupled to the output for providing an output power signal indicative of output power from the power control loop. A controller generates first and second reference signals. A differential amplifier provides a control output that is indicative of a difference between the output power signal and a reference signal. A dual rate filter couples the control output to the power control amplifier so as to vary its gain. The dual rate filter exhibits a fast-reacting filter mode when the controller changes the reference signals to the differential amplifier and a slow-reacting filter mode when the controller applies the first reference signal to the differential amplifier. The fast filter mode enables rapid feedback of the control output to the power control amplifier.

DETAILED DESCRIPTION OF THE INVENTION

Figure 2:
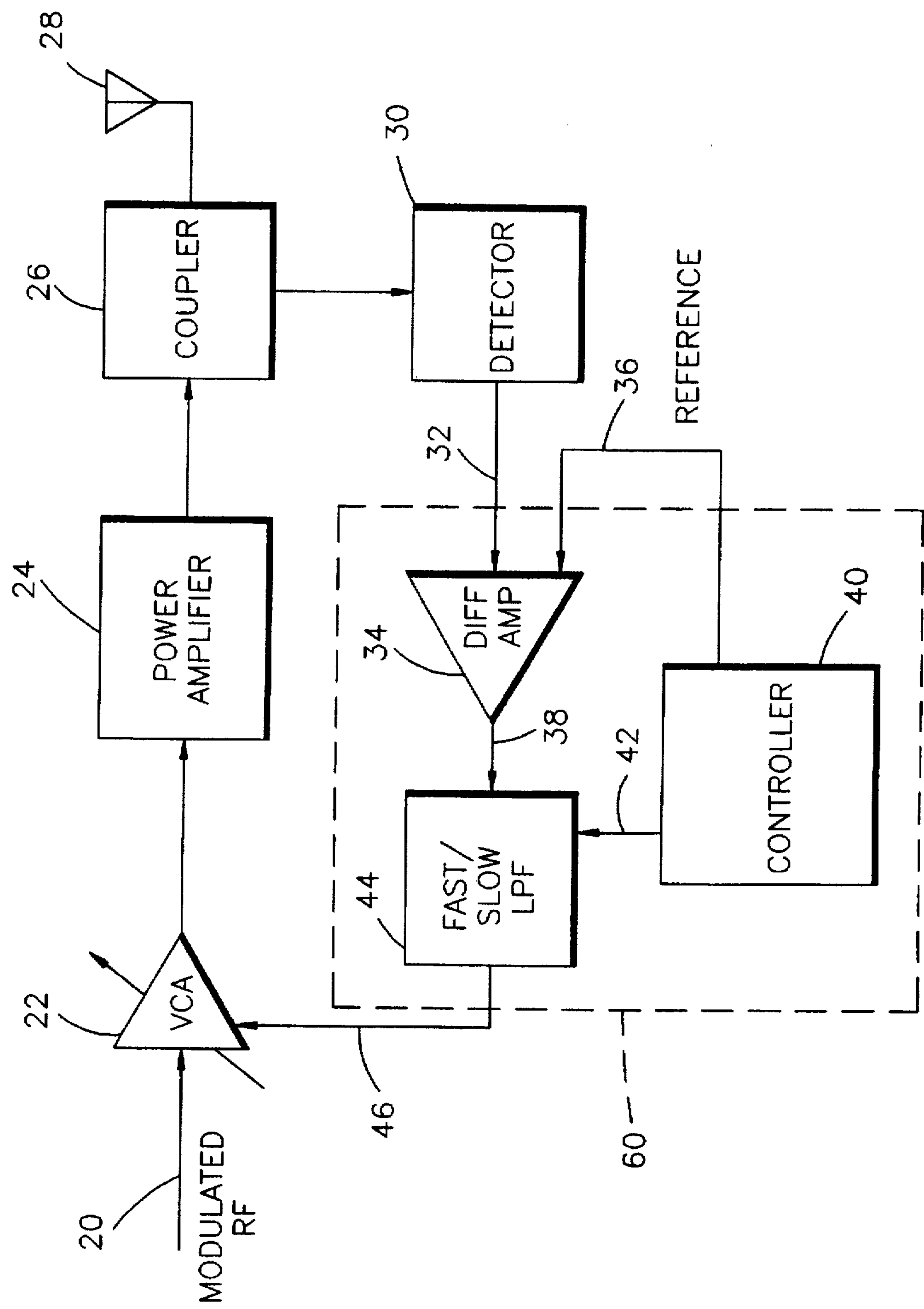
FIG. 2 is a block diagram of a circuit embodying the invention hereof.

Referring to FIG. 2, data-modulated, radio frequency (RF) signals are applied via line 20 to a voltage controlled amplifier (VCA) 22 and then to a power amplifier 24. The output from power amplifier 24 passes through a coupler 26 to an antenna 28 for transmission. Coupler 26 extracts a portion of the output signal and feeds it to a detector 30. Detector 30 provides a voltage on line 32 that is proportional to the output power. That voltage is then applied as one input to a differential amplifier 34. One or more reference voltages are applied by a controller 40, via line 36, to a second input of differential amplifier 34 and cause an output to appear on line 38 that is representative of the voltage difference between the voltage on line 32 and a reference voltage on line 36.

Controller 40 also applies a rate control signal via line 42 to fast/slow low pass filter (LPF) 44. LPF 44 also receives the output on line 38 from differential amplifier 34. The output from LPF 44 is applied as a control potential to VCA 22 and acts to alter the gain of VCA 22 in a controlled fashion. LPF 44 exhibits fast and slow filter modes in accordance with the rate control potential applied by controller 40.

When controller 40 determines that either a ramp up or ramp down period is to occur, a first rate control signal is applied to filter 44 to cause its time constant to decrease so as to enable a faster filter response action. The lessened time constant enables voltage changes appearing on LPF input line 38 to be rapidly manifest on output line 46 to VCA 22. By contrast, after the ramp up or ramp down period has passed, controller 40 applies a second rate control signal to filter 44 which increases the time constant of filter 44. The result is that filter 44 responds more slowly to voltage changes appearing on LPF input line 38 and thus alters the output potential on line 46 in a slower manner. As a result, the gain of VCA 22 is changed slowly during the slow mode so as not to affect the modulation of the RF signal.

Figure 3:
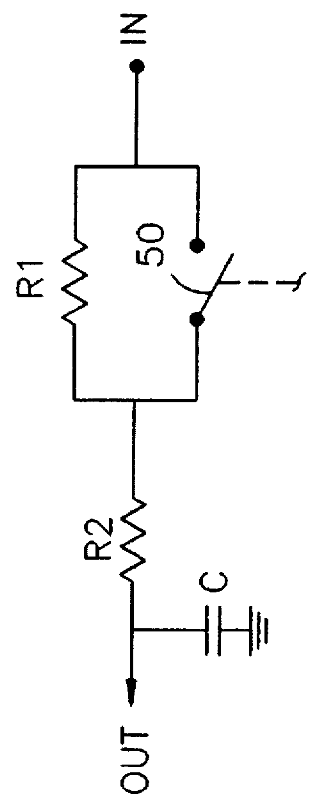
FIG. 3 is an exemplary dual rate filter for inclusion in the circuit of FIG. 2.

In FIG. 3, an exemplary fast/slow mode LPF is shown and comprises resistors R1, R2 and capacitor C. A switch 50 is controlled (by means not shown) in accordance with a rate control signal output applied via line 42. During the fast filter mode, switch 50 is closed, reducing the RC time constant of the filter. By contrast, during the slow filter mode, switch 50 is maintained in its open state so that the combined resistances of R1 and R2 cause the filter to exhibit a substantially slower filter response.

Figure 1:
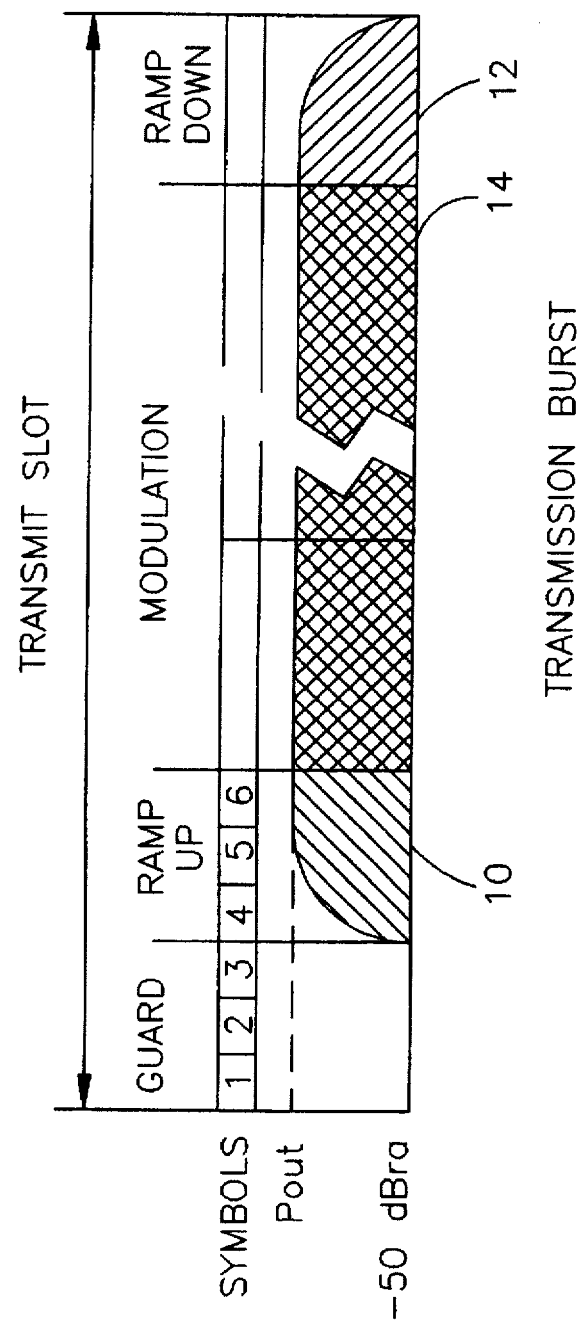
FIG. 1 is a chart showing portions of a prior art transmission time slot during which a power control circuit is required to ramp up and ramp down a transmitter's output power level.

Referring now to FIGS. 1 and 2, the operation of the invention will be described. At the beginning of ramp up period 10, controller 40 applies a first reference potential to differential amplifier 34. At the same time, controller 40 applies a fast mode control signal via line 42 to filter 44. The input to differential amplifier 32 from detector 30 is at a low logic level, causing differential amplifier 38 to manifest a large voltage input to filter 44.

Filter 44 (operating in the fast mode) applies a portion of the input signal on line 38, as a control potential to VCA 22, causing the gain of VCA 22 to increase by an increment. As a result, an unmodulated RF signal applied to VCA 22 is applied at a higher level to power amplifier 24 and coupler 26. The resulting larger value feedback from coupler 26 causes the output from detector 32 to increase, thereby decreasing by an increment the difference output on line 38, etc.

The feedback operation continues until the end of period 10 at which time, controller 40 switches the control signal on line 42 to cause filter 44 to enter the slow filter mode. Controller 40 maintains the first reference potential on line 36 for the duration of the modulation time so as to enable appropriate feedback control of the power amplifier chain.

At the beginning of ramp down time 12, controller 40 transitions its output on line 36 to a second reference potential. At the same time, a fast mode control signal is applied to filter 44 causing it to enter the fast filter mode. As a result, the difference potential on line 38 is fed back, via line 46, to VCA 22 in a "fast" manner.

One skilled in the art will understand that the circuit shown in FIG. 2 and encompassed by dotted line 60 may be configured in a microprocessor wherein the functions of differential amplifier 34, controller 40 and filter 44 are performed using digital functions. In the event that such digital circuitry is employed, the output appearing on line 32 from detector 30 would be translated into a digital value by an analog to digital converter and the control reference potentials on line 36 would be similarly digital in nature.

It should be understood that the foregoing description is only illustrative of the invention. Various alternatives and modifications can be devised by those skilled in the art without departing from the invention. For instance, during ramp up and ramp down times, stepped reference voltages may be applied by controller 40 and line 36 to differential amplifier 34 to allow a smooth transition action to occur. Accordingly, the present invention is intended to embrace all such alternatives, modifications and variances which fall within the scope of the appended claims.

What is claimed is:

1. A power control loop for a radio frequency (RF) transmitter, said power control loop including power control amplifier means and an output, and further comprising:

detector means coupled to said output for providing an output power signal indicative of output power from said power control loop;

control means for generating control signals comprising at least first and second reference signals;

difference means coupled to said detector means and said control means for providing a control output indicative of a difference between said output power signal from said detector means and a control signal from said control means; and filter means for coupling said control output from said difference means to vary gain of said power control amplifier means, said filter means exhibiting a fast filter mode when an output from said control means transitions to said first reference signal from said second reference signal and a slow filter mode at other times when said control means outputs said first reference signal, said fast filter mode enabling rapid feedback of said control output to said power control amplifier means.

2. The power control loop as recited in claim 1, wherein said slow filter mode reduces a rate of feedback of voltage variations of said control output so as to prevent said feedback from adversely affecting modulation of an RF signal being amplified by said power control amplifying means.

3. The power control loop as recited in claim 2 wherein said filter means further exhibits a fast filter mode when an output from said control means transitions from said first reference signal to said second reference signal.

4. The power control loop as recited in claim 1 wherein said RF transmitter operates to transmit time division multiple access (TDMA) signals, said signals including time slots wherein output power is ramped up to a transmission level and ramped down to a quiescent level, said control means applying further control signals to said filter means during ramp up and ramp down time slots to cause said filter means to exhibit said fast filter mode.

5. The power control loop as recited in claim 4 wherein said difference means and filter means are embodied in digital circuitry and form a portion of said control means, said control means being a digital microprocessor.

6. The power control loop as recited in claim 4 wherein said difference means is a differential amplifier and said filter means is an analog filter evidencing at least two time constants that are controllably actuatable by a switching of impedance components comprising a part thereof.

* * * * *